United States Patent
Chapman et al.

(10) Patent No.: US 6,511,347 B2
(45) Date of Patent: Jan. 28, 2003

(54) TERMINATING FLOATING SIGNALS ON A BGA MODULE TO A GROUND PLANE ON A BALL GRID ARRAY (BGA) CIRCUIT BOARD SITE

(75) Inventors: Brian D. Chapman, Poughkeepsie, NY (US); Wai Mon Ma, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/894,496

(22) Filed: Jun. 28, 2001

(65) Prior Publication Data

US 2003/0003800 A1 Jan. 2, 2003

(51) Int. Cl.⁷ .......................... H01R 13/73; H02B 1/01; H05K 7/02; H05K 7/06; H05K 7/08
(52) U.S. Cl. .......................... 439/571; 361/760
(58) Field of Search .................. 439/571, 66, 70, 439/65, 74; 361/760, 762

(56) References Cited

U.S. PATENT DOCUMENTS

| | | |
|---|---|---|
| 5,723,823 A | 3/1998 | Bell |
| 5,741,727 A | 4/1998 | Wang |
| 5,809,641 A | 9/1998 | Crudo et al. |
| 5,847,951 A * | 12/1998 | Brown et al. ................ 361/762 |
| 5,858,816 A * | 1/1999 | Sato et al. ................... 438/121 |
| 6,018,866 A | 2/2000 | Crudo et al. |
| 6,086,386 A * | 7/2000 | Fjelstad et al. ................ 439/70 |
| 6,093,476 A * | 7/2000 | Horiuchi et al. ............ 428/209 |
| 6,115,912 A | 9/2000 | Crudo et al. |
| 6,380,062 B1 * | 4/2002 | Liu ............................. 174/263 |

* cited by examiner

*Primary Examiner*—Brian Sircus
*Assistant Examiner*—Chandrika Prasad
(74) *Attorney, Agent, or Firm*—James J. Cioffi

(57) ABSTRACT

This invention relates to electrically connecting a first electronic component to a second electronic component wherein at least one of the electronic components must undergo modifications or repair when, for example, there is a floating signal generated from the first electronic component which can cause problems in operation of the electronic component assembly. For this type assembly an opening is provided in the second electronic component proximate the site or sites to be electrically connected to the first electronic component, which opening extends to an internal plane of the second electronic component desired to be connected to the first electronic component. A wire having a melting point higher than the solder used to make the assembly is used to connect the internal plane of the second electronic component to the pad of the second electronic component which second electronic component is to be electrically connected to the first electronic component thereby avoiding a floating signal in the electronic component assembly.

9 Claims, 2 Drawing Sheets

TERMINATING FLOATING SIGNALS ON A BGA MODULE TO A GROUND PLANE ON A BALL GRID ARRAY (BGA) CIRCUIT BOARD SITE

BACKGROUND OF THE INVENTION

1. Field of the Invention

This invention relates to electrically connecting one electronic component to another electronic component and, more particularly, to attaching a BGA module having floating signals to unconnected surface BGA pads on a printed circuit board.

2. Description of Related Art

The use of solder to join materials such as components of an electronic structure is well known in the art. In the electronics area there are a myriad of electronic components which require connection to other electronic components or to other levels of packaging. Examples include mounting of integrated circuit chips to a metallized substrate, multi-layer ceramic substrate (MLC), laminate organic substrate, glass ceramic substrate, card (direct-chip-attach, DCA), printed circuit board (PCB) and any substrate made of composite materials meeting thermal and mechanical properties. This description will be directed to for convenience to second level surface mount technology whereby a ball grid array (BGA) containing component is electrically connected to a printed circuit board.

The term Ball Grid Arrays (BGA's) refers to a broad class of microelectronic substrate modules that are connected to a board/card by means of an array of solder balls on the module. Such interconnections are first formed by joining solder balls to the substrate module thus creating the BGA. The BGA is subsequently joined to the PCB or card during reflow assembly.

Printed circuit boards (PCB's) or printed wiring boards (PWB's) are rigid or flexible single, double or multi-layered boards having printed conductors placed upon or within the board material. A PCB is designed to receive separately manufactured electrical components and to interconnect those components in an overall circuit structure. The joining of such components or parts is well-known in the electronics art.

PCB's are classified by the number of layers they contain as implied by the terms single-sided, double-sided and multi-layered boards. Multi-layer PCB's typically have internal interconnected conductor circuits and internal ground or power planes, as well as conductors on both sides of the board. Most industrial and commercial PCB's are manufactured from rigid copper-clad epoxy-impregnated glass fiber or a phenolic-impregnated laminate. The leads or wires from components to be joined to the board can be surface mounted or connected at plated-through holes at the terminal ends of each conductor. In a multi-layer setting, terminal ends of conductors connect at vias which extend from a buried conductor plan to a surface layer. From the surface layer, each via can be connected to an overlying electrical component by a BGA array.

Assemblies containing a circuit board and a Ball Grid Array (BGA) module typically must undergo modifications or repair. For example, a module to be connected may have an open internal net (typically referred to as a floating signal) that should actually be connected to another net, a reference voltage, supply voltage, or ground potential of a printed circuit board. Furthermore, engineering changes might be necessary once the circuit is in its operating environment. Typically, such circuit boards are discarded and replaced with new boards fabricated to include the modification.

Bearing in mind the problems and deficiencies of the prior art, it is therefore an object of the present invention to provide a method for electrically connecting one electronic component to another electronic component using solder interconnections, wherein one of the components must be adapted or repaired before component assembly.

It is another object of the present invention to provide a method for connecting a floating signal BGA pad of a component to an internal ground or voltage plane in a printed circuit board to which the component is to be connected.

A further object of the invention is to provide electronic structures made using the solder interconnection structure and method of the invention.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for connecting a pad on a first electronic component to an internal plane in a second electronic component comprising the steps of:

supplying a first electronic component such as a BGA module containing a plurality of first solder sites for solder connection to a second electronic component;

supplying a second electronic component such as a printed circuit board having a plurality of corresponding second pads for attachment to the first corresponding solder sites of the first electronic component;

forming an opening in the second electronic component from the surface of the second electronic component to an internal plane desired to be connected to the first solder site, the opening being proximate the second pad to be attached to the internal plane of the board;

attaching an electronic connector such as a wire from the internal plane to the second pad, the wire preferably having a higher melting point than the solder sites to be used to make the solder connection between the first and second components; and solder attaching the first electronic component to the second electronic component.

In a related aspect of the invention an electronic component assembly comprising a first electronic component electronically attached to a second electronic component comprises:

a first electronic component having a plurality of pads and solder connection sites thereon for connection to a second electronic component;

a second electronic component having corresponding pads thereon for attachment to the pads and solder connection sites of the first electronic component;

one or more openings in the second electronic component from the surface of the second electronic component to an internal plane desired to be electrically connected to the first electronic component, the openings being proximate the pads on the second electronic component to be connected to a corresponding pad on the first electronic component;

an electrical connector extending from the opening to the pad and connecting the internal plane of the second electronic component to the pad of the second electronic component; and the first electronic component and second electronic component pads being connected together by the solder connection sites.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
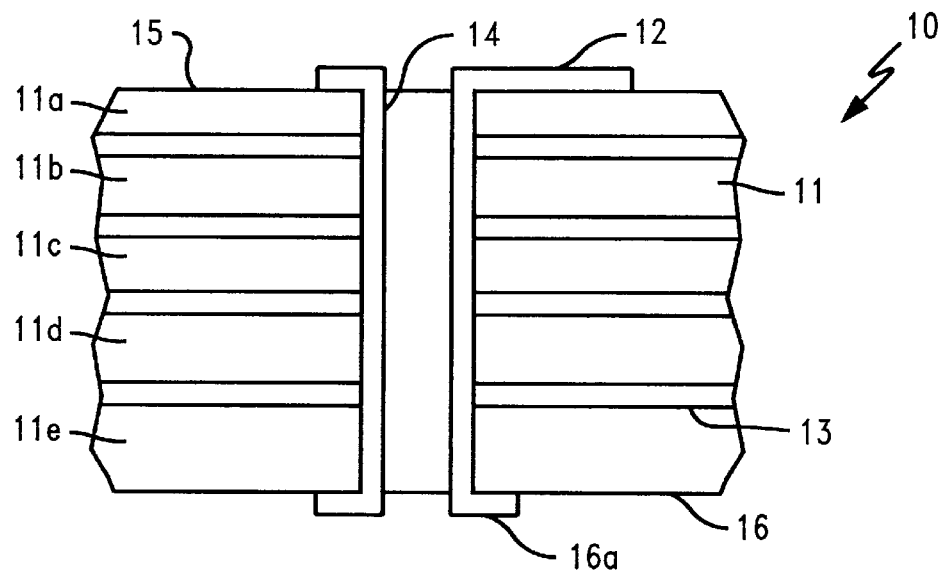
FIGS. 1 is a partial cross-sectional view of a multi-layer printed circuit board having a number of levels of wiring and internal planes.

In describing the preferred embodiment of the present invention, reference will be made herein to FIGS. 1–3C of the drawings in which like numerals refer to like features of the invention. Features of the invention are not necessarily shown to scale in the drawings.

Referring now to FIG. 1, a cross-sectional view of a typical printed circuit board (PCB) is shown. The printed circuit board 10 includes a plurality of layers 11a–11e having a top surface layer 15 and a top printed circuit layer 12. A bottom surface layer 16 and bottom printed circuit layer 16a is also shown with a plated-through hole 14 which permits connections between various levels of internal circuitry 13 of the multiple layer PCB 10.

For simplicity, the present invention will be described with respect to the embodiment shown in FIG. 2 employing a dog bone design where the solder pad and solder ball connections thereon are offset from the plated-through holes in the printed circuit board 10. An alternate design would have the solder balls axially aligned with the plated through holes in the printed circuit board.

Figure 2:
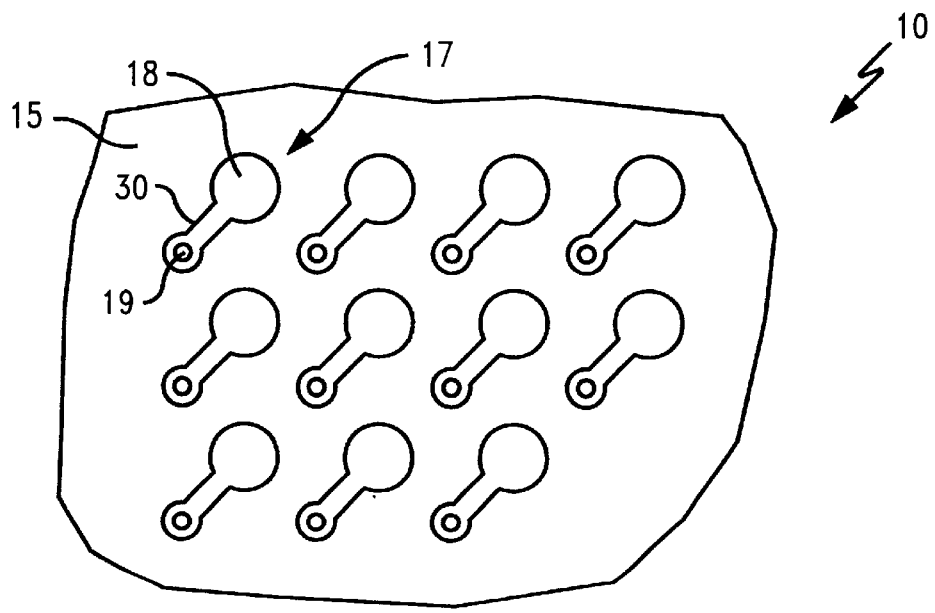
FIG. 2 is a plan view of a printed circuit board showing pads and vias with the pads and vias connected by straps.

Referring now to FIG. 2, a plan view of a typical PCB 10 is shown. The top surface 15 has thereon a dog bone design 17 comprising a pad 18, a plated via 19 and a connector 30. The pads will accept solder balls to form the BGA grid for the module to be connected to the PCB.

Figure 3A:
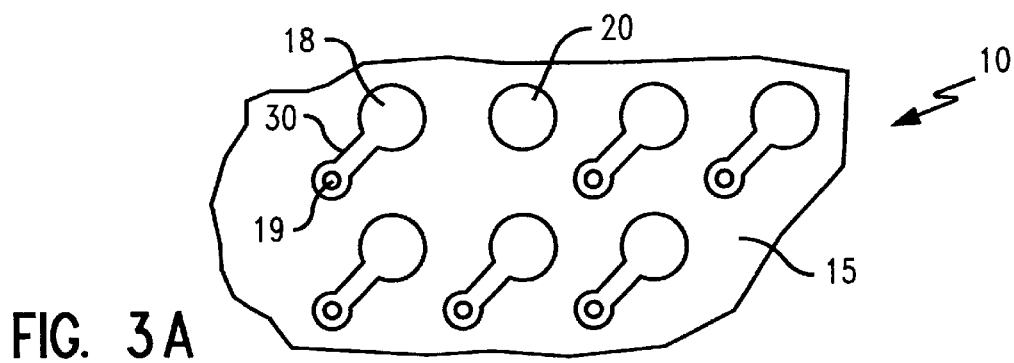
FIG. 3A is a plan view of a printed circuit board showing pads and connected vias and one pad not connected to a via.
Figure 3B:
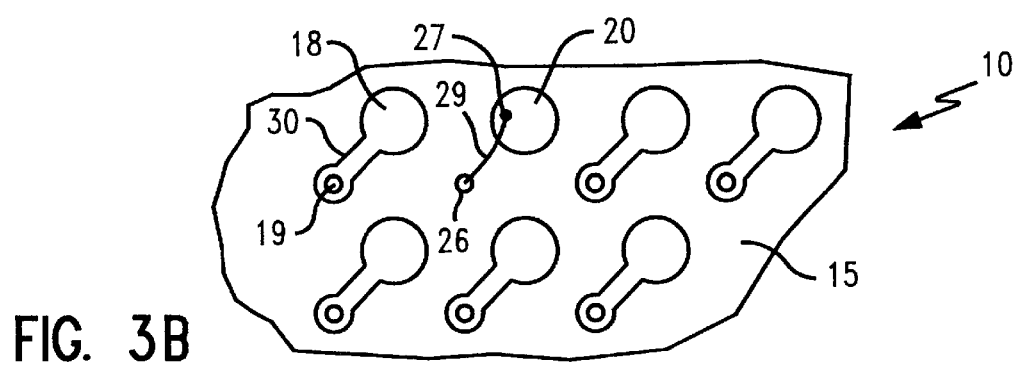
FIG. 3B is a plan view of the printed circuit board of FIG. 3A showing a wire extending from the non-via connected pad to an internal plane of the board using the method of the invention.
Figure 3C:
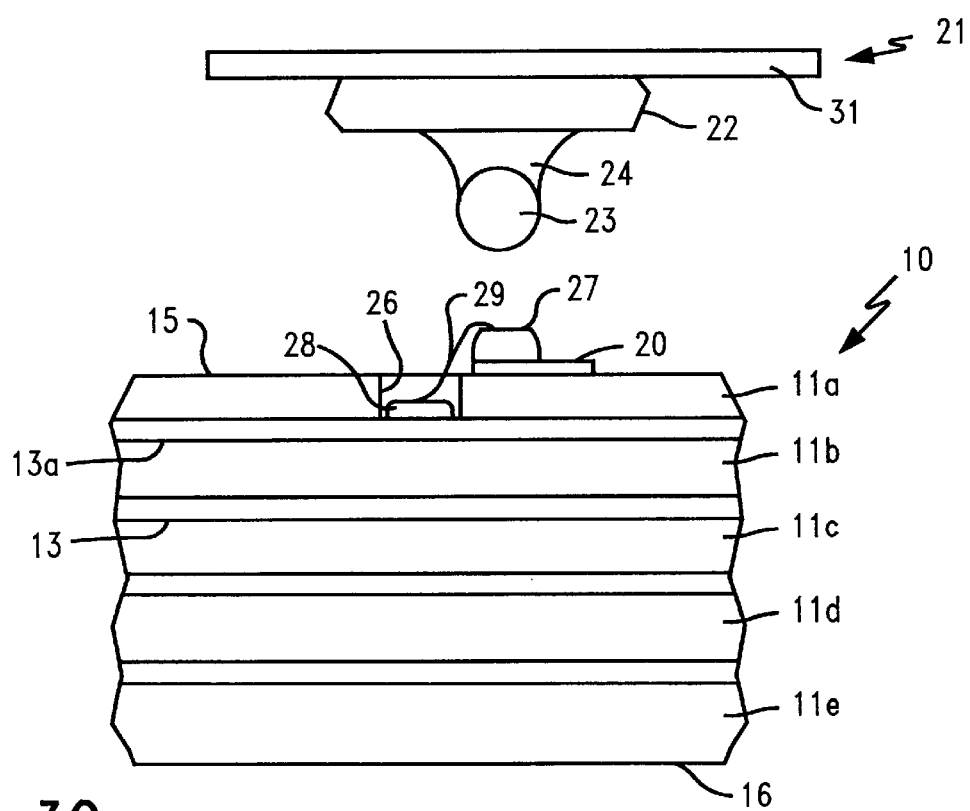
FIG. 3C is a cross-sectional view of the printed circuit board of FIG. 3B showing the printed circuit board modified by the method of the invention and ready for electrical connection to a corresponding solder site of a BGA module.

Referring now to FIGS. 3A, 3B and 3C, the method of the invention and the resulting electronic component assembly of the invention can be demonstrated.

FIG. 3A shows a plan view of a typical printed circuit board 10. The top surface layer 15 of the printed circuit board 10 contains a number of pads 18 connected by a connecting strap 30 to a via 19. Pad 20 is a surface pad that does not have a connected via and is isolated from the internal planes of the circuit board 10 and is the pad to be adapted using the method of the invention.

FIG. 3B shows a plan view of the repaired or modified printed circuit board 10. Thus, the pads 18 and vias 19 are shown still connected together using connecting strap 30 and these have not been changed. The isolated pad 20 is now connected to an internal plane of the printed circuit board 10 through a via 26 which has been drilled to a depth to reach the desired internal plane to be connected to the pad 20. A connecting wire 29 is used to connect the internal plane of printed circuit board 10 through via 26 to pad 20. A solder fillet 27 is used to secure the wire 29 to pad 20.

Referring now to FIG. 3C, a side view of the repaired printed circuit board 10 of FIG. 3B is shown. Firstly, a BGA containing module is shown generally as 21 and comprises a substrate 31 having a pad 22 thereon. The pad has a C4 solder ball 23, or a copper ball or other connector may also be used as is known in the art, connected to the pad by solder fillet 24. Solder ball 23 is positioned directly above pad 20 of printed circuit board 10 for attachment of the solder ball 23 to pad 20.

FIG. 3C shows the printed circuit board 10 having a number of dielectric layers 11a–11e and internal circuit or plane layers shown generally as 13. The printed circuit board 10 has an upper layer 15 having a pad 20 thereon and the lower layer is shown having a bottom surface 16. Via hole 26 was drilled through the top surface of printed circuit board 10 through the first layer 11a and terminated at internal layer 13a which is typically a ground plane in a printed circuit board. The opening in the printed circuit board may be drilled in a BGA siren or area array. A solder fillet 28 was used secure a wire 29 extending from the fillet 28 to pad 20. The wire 29 is secured to pad 20 by solder fillet 27. Both solder fillets 28 and 27 would typically be the same solder and is preferably a higher melting temperature solder than the solder of solder ball 23 and solder fillet 24 of substrate 21. The connecting wire 29 also preferably has a higher melting temperature than the connecting solder ball 23 or solder fillets.

Once the connecting wire 29 is secured thereto as shown in FIGS. 3B and 3C, the BGA containing module 21 to be secured to the printed circuit board 10 is positioned above PCB 10 and solder attached thereto using conventional reflow procedures.

The present invention solves the problem of attaching floating signals from a BGA module to unconnected surface BGA pads on a circuit board. Typically the error is made on the circuit board design, and these pads are not connected to the ground plane of the board by vias. The advantage of using this invention is the verification of grounding the floating signals without the delay of making new printed circuit boards. The invention does not require a change in the BGA containing module or the technique in attaching or re-attaching the module to the PCB.

The connecting wire 29 is preferably a wire such as copper or copper alloy but may be any suitable connector material in any shape, with the proviso that the melting point be higher than the melting point of the solder used to connect the BGA module to the PCB. The thickness of the wire may vary widely and is typically about 3 to 5 mils. Similarly, the solder used to hold the wire to the internal plane of the PCB pad will be a higher melting point than the attach solder of the BGA module. Other methods of wire attach could be used such as laser welding.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for connecting a solder site on a first electronic component to an internal plane in a second electronic component, where the repair of an open internal net in the second electronic component or an engineering change is required, comprising the steps of:

supplying the first electronic component containing a plurality of solder sites for solder connection to a second electronic component;

supplying the second electronic component having a surface and a plurality of corresponding pads on the surface for direct attachment to the solder sites of the first electronic component, with at least one pad initially not having a via connected to the internal plane, such that the pad is isolated from the internal plane of the second electronic component;

subsequently forming an opening in the second electronic component from the surface of the second electronic component to the internal plane desired to be connected to a solder site of the first electronic component, the opening being proximate the isolated pad to be attached to the internal plane of the second electronic component;

attaching an electrical connector from the internal plane to the isolated pad through the formed opening in the surface of the second electronic component to repair an open internal net in the second electronic component or to create a required engineering change, the connector having a higher melting point than the solder to be used to make the solder connection between the first and second electronic components; and subsequently using a solder for attaching the solder sites of the first electronic component to the corresponding pads of the second electronic component.

2. A method according to claim 1 wherein the opening in the second electronic component is drilled in a ball grid array siren or area array.

3. A method according to claim 1 wherein the electrical connector attached from the internal plane to the isolated pad is a copper wire.

4. The method according to claim 1 wherein the electrical connector is attached to the internal plane and to the isolated pad of the second electronic component using a solder having a higher melting point than the solder used to make the solder connection between the first and second electronic components.

5. The method according to claim 1 wherein the electrical connector is attached using a laser welding process.

6. An electronic component assembly comprising a first electronic component electrically attached to a second electronic component having an internal plane, where the repair of an open internal net in the second electronic component or an engineering change is required:

the first electronic component having a plurality of solder connection sites thereon for connection to a second electronic component;

the second electronic component having a surface and a plurality of corresponding pads on the surface for direct attachment to the solder connection sites of the first electronic component, with at least one pad initially not having a connected via such that the pad is isolated from the internal plane of the second electronic component;

at least one opening subsequently formed in the second electronic component from the surface of the second electronic component to the internal plane desired to be electrically connected to the first electronic component, the formed opening being proximate the isolated pad on the second electronic component;

an electrical connector attached from the internal plane of the second electronic component through the formed opening to the isolated pad of the second electronic component to repair an open internal net in the second electronic component or to create a required engineering change; and the first electronic component and second electronic component pads being connected together by the solder connection sites.

7. The electronic component assembly of claim 6 wherein the first component is a ball grid array.

8. The electronic component assembly of claim 6 wherein the second component is a printed circuit board.

9. The electronic component assembly of claim 6 wherein the first component is a ball grid array and the second component is a printed circuit board.

* * * * *